United States Patent [19]

Shrivastava

[11] Patent Number: 4,499,652

[45] Date of Patent: Feb. 19, 1985

[54] METHOD OF FORMING A MOSFET WITH BOTH IMPROVED BREAKDOWN RESISTANCE AND LESS HOT-ELECTRON EFFECTS

[75] Inventor: Rituparna Shrivastava, Denton, Tex.

[73] Assignee: Mostek Corporation, Carrollton, Tex.

[21] Appl. No.: 532,259

[22] Filed: Sep. 15, 1983

[51] Int. Cl.³ .......................................... H01L 21/265
[52] U.S. Cl. ................... 29/571; 29/576 B; 148/1.5; 357/23
[58] Field of Search .............. 29/571, 576 B; 148/1.5; 357/23 D, 23 VD, 91, 23 SC

[56] References Cited

U.S. PATENT DOCUMENTS 4,247,860 1/1981 Tihanyi ........................... 357/23 D

OTHER PUBLICATIONS

Colclaser, R. A., *Microelectronics: Processing and Device Design*, John Wiley & Sons, N.Y., 1980, TK 7874 C63 C.2, pp. 256–266.

*Primary Examiner*—Brian L. Hearn
*Assistant Examiner*—Alan E. Schiavelli
*Attorney, Agent, or Firm*—Eric W. Petraske

[57] ABSTRACT

A field effect transistor has improved punch-through resistance by the implantation of a dose of ions through the center of the active area. The energy of the dose is such that the ion concentration peaks at the depth most susceptible to punch-through. The threshold voltage of the transistor is set by the combination of a lower than normal threshold implant and the tail concentration of the blocking implant.

3 Claims, 3 Drawing Figures

METHOD OF FORMING A MOSFET WITH BOTH IMPROVED BREAKDOWN RESISTANCE AND LESS HOT-ELECTRON EFFECTS

DESCRIPTION

1. Technical Field

The field of the invention is the fabrication of field effect transistors with improved punch-through resistance.

2. Background Art

In small transistors, a known problem is electrical punch-through in the substrate between the source and the drain.

One method in the prior art of reducing punch-through is to ion-implant a layer of ions in the active area extending from the source diffusion all the way to the drain diffusion. This method has the substantial disadvantage that it increases the junction capacitance of source/drain, and thus increases the switching time of the transistor.

It is known to implant the channel in order to inactivate the transistor by raising the threshold voltage to a high value. In this inactivation method, change in transistor capacitance and radiation damage are not relevant because the transistor is inactivated.

The art has sought an increased resistance to punch-through without a deleterious effect on the threshold voltage and without an increase in the junction capacitance.

DISCLOSURE OF INVENTION

The invention relates to a method of blocking source-drain punch-through without affecting the threshold voltage or the capacitance.

A feature of the invention is the use of a nonstandard threshold voltage implant that has an ion concentration considerably less than normal.

Another feature of the invention is the implantation of a vertical wall of blocking ions below a portion of the channel region in a limited channel length.

Yet another feature of the invention is the reduction of adverse hot-electron effects.

Yet another feature of the invention is that the transistor threshold voltage is set by a combination of the threshold voltage implant and the tail of the punch-through implant concentration.

BEST MODE OF CARRYING OUT THE INVENTION

Figure 1:
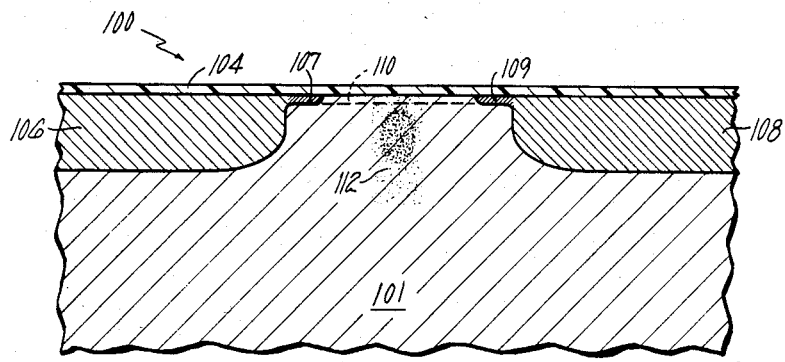
FIG. 1 illustrates a cross section of a transistor constructed according to the invention.

FIG. 1 illustrates a cross section of a partially completed transistor fabricated according to the invention. Transistor 100 has a gate oxide layer 104, a channel region 110 having a channel width along a first axis and a channel length along a second axis perpendicular to the first axis, a source region 106, drain region 108, both labeled n+ to indicate a relatively heavy ion concentration of approximately $10^{21}$ ions/cm$^3$ and source and drain extensions 107 and 109 respectively, labeled n− to indicate a lighter doping of approximately $10^{17}$ ions/cm$^3$. Extensions 107 and 109 are shallow compared to 106 and 108 and have a lighter concentration, as is known in the art, to reduce gate capacitance. Below the center of channel 110, blocking wall 112 has been implanted with a dose of boron for an NMOS transistor, in P doped substrate 101. Illustratively, the depth of source 106 and drain 108 is approximately 0.4 microns and the energy of the ion implant for wall 112 is set to produce a peak concentration at a depth of 0.5 microns depending on where the maximum danger from punch-through is expected. Different source and drain profiles and processing methods will produce different punch-through characteristics. The wall area extends below the peak concentration, because of the straggling phenomenon and extends above the distance of the peak concentration up to and into channel region 110 because of the nearly gaussian spread of the ion concentration. The significance of the combination of the shallow penetration tail of the ion concentration and the threshold implant will be discussed below. After the implantation of the boron wall, a polycrystalline gate having a gate length along the second axis and substantially equal to the channel length will be deposited and the remainder of the transistor finished according to conventional methods.

Figure 2:
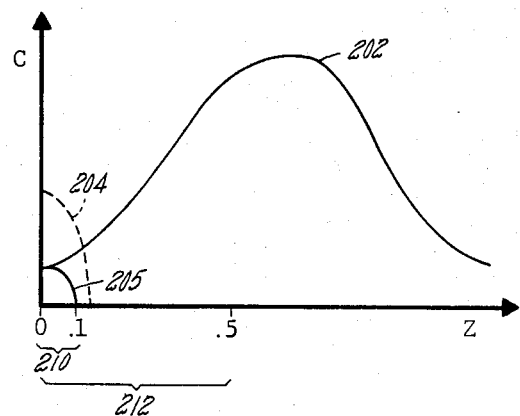
FIG. 2 illustrates a graph of the impurity ion concentration of the transistor in FIG. 1 in the vertical direction.

Referring now to FIG. 2 we see a graph indicating the ion concentration, C, as a function of depth, Z, extending downward from the gate oxide interface into the substrate at the center of the channel region. Curve 202 indicates the nearly gaussian concentration of the main dose of the ion implant, peaking a distance 212 below the surface, illustratively 0.5 microns. Curve 205 represents the ion concentration of the threshold voltage implant. It will be noticed that this concentration is comparable to the concentration in the tail of curve 202. The tail concentration will, of course, be subject to statistical fluctuations that will be comparable in magnitude to the value of the threshold implant in this region. The region of the threshold implant is indicated by the distance 210 in the figure and is illustratively 0.1 microns. The threshold voltage in the region at the center of the gate will be set by the combination of the ion concentration from the threshold voltage implant and from the blocking implant. In order to produce a reliable and consistent value for the threshold voltage, which is important in reliable device operation, it is necessary to minimize the effect of fluctuations in the straggling tail of curve 202.

The magnitude of the tail will depend upon a number of parameters, including, in particular, the depth of the peak of the curve 202, and its standard deviation. If the parameters in a particular case are such that the magnitude of curve 202 in region 110 is less than about a third of the magnitude of curve 205, then there is no problem and the value of the threshold voltage will be dominated by the threshold voltage implant. In ordinary cases such as the illustrative example discussed in detail below, this will not be the case. In that case, the value of the threshold voltage will be set predominantly by the value of the ion concentration from the blocking dose. If the fluctuation in the concentration of the tail in channel 110 at a distance 210 is sufficiently high, it may be preferable to include a second implant which is used for tuning threshold voltage. Such an implant is indicated in FIG. 2 by curve 204 and is selected to be of a magnitude such that it dominates the statistical fluctuations in curve 202. In this case, the value of the threshold voltage is set by the combination of curve 205 and 204 and the fluctuations in curve 202 do not take the threshold voltage outside of the tolerance range for the transistor.

In fabrication, the transistor is fabricated conventionally up until the step of processing the active area. Before the fabrication of the gate, a mask having an aperture centered on the channel region but having a line width smaller than the channel length is used to perform the blocking implant. The requirement that the line width be smaller than the channel length is to allow for misalignment so that the blocking wall does not touch either region 107 or 109 of the source and drain. A suitably thick photoresistive layer is used in this step to form an aperture through which the blocking dose may be applied. The thickness of the photoresist must be sufficiently great to block the implant for region 112 from reaching the gate oxide outside the aperture. If desired, a second implant is made through the same aperture to form the threshold trimming implant of curve 204. The blocking photoresist is then removed and the remainder of the transistor is constructed according to conventional steps.

Figure 3:
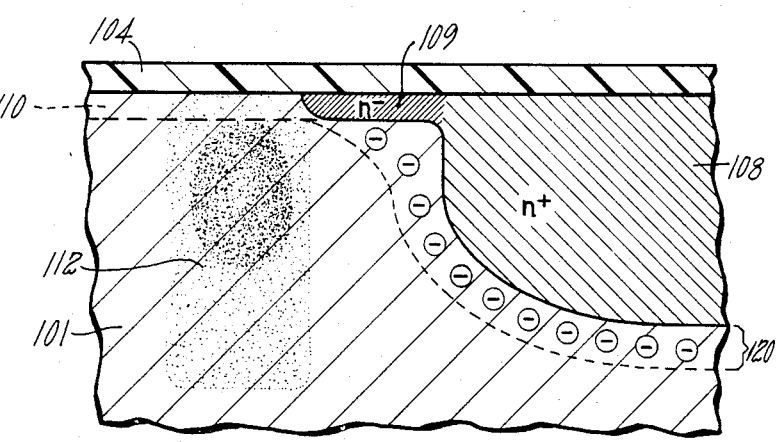
FIG. 3 illustrates an enlarged cross section of a portion of the transistor of FIG. 1 near the drain area.

FIG. 3 shows in detail the consequences of misalignment of the implant wall towards the drain area. In this figure, wall 112 is displaced towards lightly doped drain area 109 and main drain area 108. The depletion region indicated by the numeral 120 near the drain has a row of minus signs at the boundary, indicating that when the drain is at a positive voltage, holes within the substrate are forced away from the junction region leaving behind the negative ions. One advantage of the invention is that if the wall is displaced slightly towards the drain area, so that the P-doped region in the wall is not in contact with the depletion region, the transistor threshold voltage and the drain to substrate junction capacitance are substantially unaffected. If the misalignment is sufficiently great so that wall 112 touches the depletion region, then the effective extent of the region will be decreased from the previous value and would include part of the wall. This will increase the drain to substrate junction capacitance and also will increase the field at the channel to drain junction, thus reducing the breakdown or snapback voltage of the transistor. The magnitude of these effects will depend upon the extent of the doping and the extent of the misalignment of course. One advantage of the invention is that the transistor will still be working even though its capacitance will be increased and its breakdown voltage will be reduced. If the implant wall is misaligned towards the source region and the source is at a fixed potential, as is conventional, there will be substantially no adverse effect from that misalignment.

An improved version of the invention for minimum pitch, or spacing between adjacent transistors, utilized an arsenic implant for the n+ region of drain 108 and a phosphorus region for the shallower n− region 109. The reason for this preference for two implant varieties is that the graded profile available with phosphorus will give smaller fields in the critical gate-drain region than with arsenic.

An advantageous feature of this process compared with the prior art is that the electric field in the channel near the drain is low, thus minimizing the well known adverse hot electron effects. The cause of this is the ability to use a lightly doped shallow region 109 and also the fact that the threshold voltage implant on the edges of the channel near the source and drain will be lower than it would be if the channel had a uniform threshold voltage implant.

Another advantage is that punch-through between source and drain can be controlled at any depth by varyng the energy of the ionization implant, without adversely affecting the drain field or the junction capacitance. Prior art methods of suppressing punch-through implant, such as a deep implant extending across the channel area, do increase the capacitance of the transistor.

The Gummel number for the lateral NPN transistor that is formed from the source, substrate and drain can also be controlled by means of a deep implant wall, thus controlling the "snapback" effect. When electronhole pairs are formed in the drain region of the channel by impact ionization, the holes will migrate through the substrate by a path that passes through wall 112, since the heavier doping produces low resistance path. As a result, there will be less of a tendency for the holes to forward-bias the source to substrate junction and thus less tendency for the device to have a "snapback".

A further advantageous feature is that the n+ region 108 can be brought closer to the gate, using a smaller wing region 109, than is possible in the prior art because of the blocking effect of the wall. Thus, transistors can be spaced more closely than is possible with the prior art method.

An example of the application of the method, a substrate having a resistivity of thirty to sixty ohms per square has the source and drain of arsenic at a concentration of $10^{21}$ cm$^{-3}$ and a depth of 0.4 micron with a shallow implant region of phosphorus having a concentration of $10^{17}$ cm$^{-3}$ and depth of 0.2 microns, the length of regions of 107 and 109 being 0.2 microns. A threshold voltage implant with dose of $6 \times 10^{11}$ ions per square centimeter at an energy of 50 KeV is used for a preliminary active area implant. A photoresist layer is applied with an aperture of 0.3 microns centered on what is to become the gate area. The total channel length is to be 0.5 microns, giving an allowance of 0.1 micron on either side of the boron wall. This corresponds well with alignment errors of advanced phototools like E-beam machines of plus and minus 0.05 micron, thus giving adequate alignment tolerance. An illustrative blocking dose of boron is applied at an energy of 200 KeV with a dose of ions per square centimeter. According to detailed calculations, this results in an implant depth that peaks at a depth of 0.5 microns and has a standard deviation of plus and minus 0.17 microns. The second threshold voltage implant is set at $1 \times 10^{12}$ ions per centimeter square at 50 KeV. This tail concentration, gives a net threshold voltage in the region above the boron wall of one volt, with 200 Angstrom gate oxide thickness consistent with conventional transistor integrated circuit practice.

I claim:

1. A method of forming a field-effect transistor comprising the steps of:
    forming a gate oxide layer on a substrate;
    forming an active region of predetermined channel width along a first axis by implanting a threshold ion dose of one conductivity type, having a threshold dose magnitude, through said oxide layer for the purpose of producing a predetermined transistor threshold voltage;
    forming a subsurface doped region, having a subsurface length and of a subsurface conductivity type, by implanting a predetermined dose of ions of said subsurface conductivity type, and having a maximum ion density at a predetermined subsurface depth;

forming a gate above said channel region, having a gate length along a second axis in said channel region perpendicular to said first axis; and forming source and drain regions in said substrate on either side of said gate length and across said channel width, whereby a channel region is defined in said substrate below said gate, having a channel length substantially equal to said gate length and being bounded by said source and drain regions; characterized in that:

said subsurface doped region is implanted through a single blocking-implant aperture having said subsurface length along said second axis and less than said gate length, lying wholly within said gate length and being substantially centered with respect to said gate;

said subsurface conductivity type is said one conductivity type, so that the conductivity type of said active region within said subsurface length is the same as the conductivity type of said active region outside said subsurface length; and said blocking ion concentration has a substantial predetermined tail magnitude within said channel region, whereby said transistor threshold voltage is determined by the combination of said threshold dose magnitude and said tail magnitude.

2. A method according to claim 1, further characterized in that said threshold ion dose has a first dose magnitude substantially less than a dose magnitude sufficient to produce said predetermined transistor threshold, whereby the operating threshold voltage of said transistor is determined by the combination of said first dose magnitude and said tail magnitude, and the ion concentration in said active region is substantially less outside said blocking portion than inside said blocking portion.

3. A method according to claim 2, further characterized in that a tuning ion-implant, having a tuning magnitude for determining said threshold voltage, is performed in said blocking portion of said channel region with a tuning implant energy such that said tuning ions are concentrated substantially within said channel region, whereby said transistor threshold voltage is substantially determined by the combination of said tuning magnitude and said first dose magnitude and is substantially uneffected by fluctuations in said tail magnitude.

* * * * *